United States Patent
Lyons et al.

(10) Patent No.: US 9,178,515 B2
(45) Date of Patent: Nov. 3, 2015

(54) CIRCUITS AND METHODS FOR SHARING BIAS CURRENT

(71) Applicant: VIASAT, INC., Carlsbad, CA (US)

(72) Inventors: Michael R Lyons, Gilbert, AZ (US);
Kenneth V Buer, Gilbert, AZ (US);
Qiang Richard Chen, Gilbert, AZ (US);
Algirdas Navickas, Mesa, AZ (US)

(73) Assignee: VIASAT, INC., Carlsbad, CA (US)

( * ) Notice: Subject to any disclaimer, the term of this patent is extended or adjusted under 35 U.S.C. 154(b) by 112 days.

(21) Appl. No.: 13/840,473

(22) Filed: Mar. 15, 2013

(65) Prior Publication Data

US 2014/0049307 A1  Feb. 20, 2014

Related U.S. Application Data

(60) Provisional application No. 61/683,138, filed on Aug. 14, 2012.

(51) Int. Cl.
*G11C 5/14* (2006.01)
*H03K 19/0175* (2006.01)

(52) U.S. Cl.
CPC .................................. *H03K 19/0175* (2013.01)

(58) Field of Classification Search
CPC ..... H03F 1/302; H03F 2200/18; H03F 1/301; H03F 1/0261; H03F 1/30
USPC .................. 327/530, 544, 538; 330/295, 296
See application file for complete search history.

(56) References Cited

U.S. PATENT DOCUMENTS

| | | | | |
|---|---|---|---|---|
| 4,622,476 A * | 11/1986 | Venkatesh | ...................... | 327/513 |
| 5,293,148 A * | 3/1994 | Hancock | ........................ | 338/295 |
| 6,163,220 A * | 12/2000 | Schellenberg | ................ | 330/295 |
| 6,448,917 B1 * | 9/2002 | Leung et al. | ................... | 341/144 |
| 6,922,106 B2 * | 7/2005 | Lautzenhiser et al. | ......... | 330/295 |
| 7,522,001 B2 * | 4/2009 | Yamamoto et al. | ........... | 330/285 |
| 8,618,971 B1 * | 12/2013 | Li | .................................. | 341/145 |
| 2005/0140534 A1* | 6/2005 | Nishi et al. | ..................... | 341/154 |
| 2009/0189695 A1* | 7/2009 | Lai et al. | ........................ | 330/295 |

OTHER PUBLICATIONS

Heins et al. "X-band GaAs mHEMT LNAs with 0.5 dB Noise Figure", IEEE MTT-S International Microwave Symposium Digest, Jun. 2004, pp. 149-152.
Marsh, "Practical MMIC Design", Artech House, ISBN: 978-1-59693-036-0, 2006, pp. 146-149.

* cited by examiner

*Primary Examiner* — Quan Tra

(57) ABSTRACT

The present disclosure includes systems and methods for sharing bias current. In one embodiment, shared bias current passes through a first level device to one or more second level devices along a bias current path. Multiple active devices may share bias current along a bias current path and process signal along the same or different signal paths. In one embodiment, bias current from one device is split among multiple devices. In another embodiment, bias current is combined from multiple devices into a device. Embodiments may include an interstage circuit along a signal path that improves stability of the circuit.

20 Claims, 7 Drawing Sheets

CIRCUITS AND METHODS FOR SHARING BIAS CURRENT

CROSS REFERENCE TO RELATED APPLICATIONS

The present disclosure claims priority to U.S. Provisional App. No. 61/683,138 filed Aug. 14, 2012, the content of which is incorporated herein by reference in its entirety for all purposes.

BACKGROUND

The present disclosure relates to electronic circuits, and in particular, systems and methods for sharing bias current in electronic circuits.

Electronics systems and devices use ever increasing numbers of active devices (e.g., transistors). Active devices are typically operated with a bias current, which results in power usage. For integrated circuits in which low power consumption is desired, the overall contribution of the bias currents from many individual devices can result in undesirably high power usage, even when the integrated circuit is merely powered on in an idle state.

Power consumption is a particularly important problem in RF amplifiers. Many wireless systems run on batteries or other limited power supplies, such as a solar cell. If an RF amplifier consumes large amounts of current, it may reduce the operating lifetime of the system. In many RF amplifier designs, different amplification stages are each separately connected to a power supply rail. Thus, active devices in each stage each draw bias current which may be added together to determine a total bias current for an amplifier, for example. Given the performance demands on such circuits, the total bias current in an RF amplifier may be very high, which results in a correspondingly high power load on energy systems that provide power to circuitry in the system.

SUMMARY

The present disclosure includes circuits and methods for sharing bias currents. In one embodiment, the present invention includes a circuit comprising a bias circuit configured to establish a first bias current, a first level device coupled to the bias circuit, wherein the first bias current passes through the first level device, and a plurality of N second level devices coupled to the bias circuit through the first level device, wherein the first bias current is split into N portions, and each one of the N portions passes through one of the plurality of N second level devices.

In one embodiment, the plurality of N second level devices each have approximately the same size, and the N portions of the bias current are equal to each other.

In one embodiment, the plurality of N second level devices each have different sizes, and the N portions of the bias current are not equal to each other, and wherein the N portions of the bias current split in proportion to the sizes of the N second level devices.

In one embodiment, the second level devices each have a size different from a size of the first level device.

In one embodiment, the circuit further comprises a plurality of M third level devices coupled to the bias circuit through the first level device and one or more of the second level devices, wherein one of the N portions is split into M portions, and each one of the M portions passes through one of the M third level devices.

In one embodiment, the operating point of the first level device is different from the operating points of the second level devices.

In one embodiment, the circuit further comprises a third level device coupled to at least two of the N second level devices, wherein at least two of the N portions are combined and pass through the third level device.

In one embodiment, the first level device and the second level devices are configured along one or more signal paths.

In one embodiment, the first level device comprises a first terminal for receiving the first bias current and a second terminal for outputting first the bias current, and wherein the second level devices each comprise a first terminal for receiving one of said N portions of the first bias current, the circuit further comprising a plurality of inductors configured between the second terminal of the first level device and the first terminal of the second level devices.

In one embodiment, the circuit further comprises an interstage circuit configured along a signal path between the first level device and one of the second level devices, the interstage circuit configured to couple a node in the signal path to ground at low frequencies to increase the stability of the circuit.

In one embodiment, the interstage circuit comprises a first capacitor, a second capacitor, and an inductor, wherein the first capacitor and second capacitor are configured in series between the first level device and the second level device, wherein the node is between the first capacitor and second capacitor, and wherein the inductor is configured from the node to ground.

In one embodiment, the circuit is an integrated circuit. In another embodiment, the circuit is a monolithic microwave integrated circuit (MMIC).

In another embodiment, the present invention includes a method comprising establishing a first bias current from a bias circuit, passing the first bias current through a first level device coupled to the bias circuit, and splitting the first bias current into N portions and each one of the N portions passes through one of a plurality of N second level devices coupled to the bias circuit through the first level device.

In another embodiment, the present invention includes a method of establishing bias currents in an integrated circuit comprising providing a plurality of active semiconductor devices and defining a shared bias current path between the plurality of active semiconductor devices wherein a bias current passes through a first one of the plurality of active semiconductor devices and is split among a second one and a third one of the plurality of active semiconductor devices.

In one embodiment, the method further comprises fabricating the integrated circuit.

In one embodiment, the method further comprises selecting a size of a first one of the plurality of active semiconductor devices to optimize a device parameter.

In one embodiment, the method further comprises selecting a size of a second one of the plurality of active semiconductor devices to optimize a device parameter, wherein the size of the second one is different than the size of the first one.

In another embodiment, the present invention includes a circuit comprising a plurality of active semiconductor devices, a bias circuit coupled to the plurality of active semiconductor devices, and a plurality of interconnecting components coupling the bias circuit to the plurality of active semiconductor devices to establish a bias current path distributing the bias current among the plurality of active semiconductor devices, wherein the bias current path comprises a branch splitting the bias current between at least two of the plurality of active semiconductor devices, and wherein at least one of the active semiconductor devices is configured between the branch and the bias circuit.

In one embodiment, the bias current path defines a parallel arrangement of at least two of the plurality of active semiconductor devices.

In one embodiment, the bias current path defines a series arrangement of at least two of the plurality of active semiconductor devices.

In one embodiment, the bias current path further comprises a node combining the bias current between at least two of the plurality of active semiconductor devices.

In one embodiment, the interconnecting components define a direct current path.

In one embodiment, the circuit further comprises a plurality of interconnecting components coupling a signal to at least two of the plurality of active semiconductor devices to establish an alternating current path among the at least two of the plurality of active semiconductor devices, wherein the alternative current path is different than the bias current path.

In one embodiment, the plurality of active semiconductor devices are arranged to form at least two distinct functional circuits.

In one embodiment, the plurality of active semiconductor devices comprises at least two active semiconductor devices having different sizes.

In some embodiments, a method of establishing bias currents in an integrated circuit is provided. The method can include providing a plurality of active semiconductor devices. For example, the integrated circuit can be defined using various computer-implemented computer automated design tools. In some embodiments, the integrated circuit can be fabricated in a semiconductor foundry.

In some embodiments, a method of establishing bias currents in an integrated circuit can include defining a shared bias current path between the plurality of active semiconductor devices. The bias current path can be defined so that a bias current passes through a first one of the plurality of active semiconductor devices. The bias current path can also be defined so that the bias current also splits between a second one and a third one of the plurality of active semiconductor devices.

In some embodiments, a method of establishing bias currents in an integrated circuit can include selecting a size of the first one of the plurality of active semiconductor devices to optimize a device parameter. For example, the device parameter can be gain, noise figure, current drive, threshold voltage, or the like. In some embodiments, the method can include selecting a different size of the second and third devices to optimize a device parameter.

The following detailed description and accompanying drawings provide a better understanding of the nature and advantages of the present disclosure.

DETAILED DESCRIPTION

Figure 1:
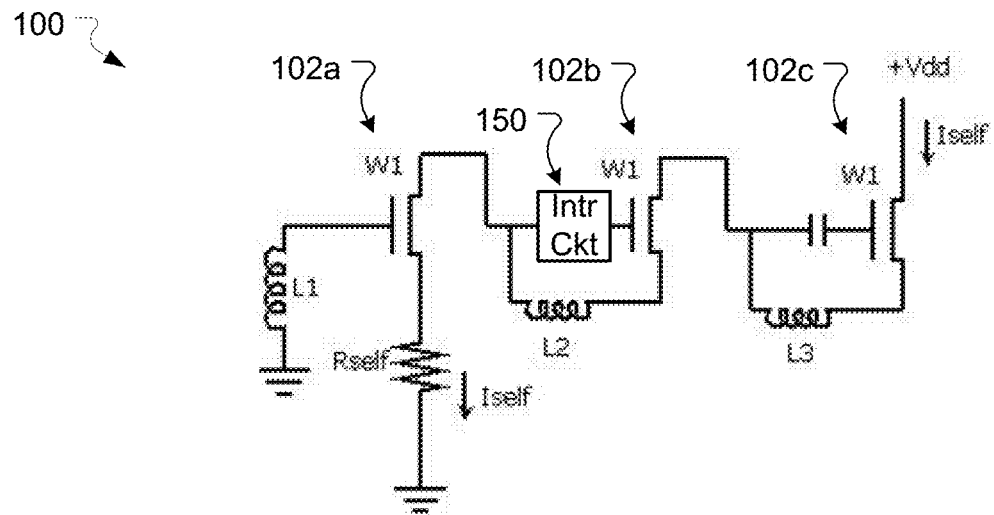
FIG. 1 is a circuit diagram of a bias current sharing scheme in accordance with some embodiments of the present invention.

The present disclosure pertains to sharing bias current in electronic circuits. Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

In describing the present invention, the following terminology will be used: The singular forms "a," "an," and "the" include plural referents unless the context clearly dictates otherwise. Thus, for example, reference to an item includes reference to one or more items. The term "ones" refers to one, two, or more, and generally applies to the selection of some or all of a quantity. The term "plurality" refers to two or more of an item. The term "device" may refer to one functional unit, which may include one or multiple functional sub-units (e.g., transistors). The term "about" means quantities, dimensions, sizes, formulations, parameters, shapes and other characteristics need not be exact, but may be approximated and/or larger or smaller, as desired, reflecting acceptable tolerances, conversion factors, rounding off, measurement error and the like and other factors known to those of skill in the art. The term "substantially" means that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide. Numerical data may be expressed or presented herein in a range format. It is to be understood that such a range format is used merely for convenience and brevity and thus should be interpreted flexibly to include not only the numerical values explicitly recited as the limits of the range, but also interpreted to include all of the individual numerical values or sub-ranges encompassed within that range as if each numerical value and sub-range is explicitly recited. As an illustration, a numerical range of "about 1 to 5" should be interpreted to include not only the explicitly recited values of about 1 to about 5, but also to include individual values and sub-ranges within the indicated range. Thus, included in this numerical range are individual values such as 2, 3 and 4 and sub-ranges such as 1-3, 2-4 and 3-5, etc. This same principle applies to ranges reciting only one numerical value (e.g., "greater than about 1") and should apply regardless of the breadth of the range or the characteristics being described. A plurality of items may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. Furthermore, where the terms "and" and "or" are used in conjunction with a list of items, they are to be interpreted broadly, in that any one or more of the listed items may be used alone or in combination with other listed items. The term "alternatively" refers to selection of one of two or more alternatives, and is not intended to limit the selection to only those listed alternatives or to only one of the listed alternatives at a time, unless the context clearly indicates otherwise.

As mentioned above, bias current results in power consumption, even when a circuit is idle. As bias currents are typically constant, they are sometimes referred to as direct current (DC) bias. Such DC bias results in a DC power consumption. In contrast, during operation, signals may vary or switch, which can result in additional power consumption, sometimes referred to as alternating current (AC) and AC power consumption.

Reduction of DC bias current can be desirable, as this can reduce overall DC power consumption. The level of DC bias current may set the operating point of the device, which is often a function of the performance desired for that device. The DC bias current cannot, therefore, be set to an arbitrarily small value.

One approach for saving power is to share DC bias current among multiple devices. For example, in a shared or stacked bias arrangement, a single, common bias current is passed serially through several different devices. For example, FIG. 1 illustrates an arrangement of stacked bias for an amplifier 100 having three transistors 102a, 102b, 102c. DC bias current (Iself) is developed in a self-biasing arrangement (using resistor Rself), and the bias current flows through all three devices (through inductors L2 and L3). In this example, the transistors are illustrated as FET devices. Dimensions of a device, such as a gate length and width (W/L), may be a factor in setting bias current. In this example, the peripheries (sizes, W1) of the devices are substantially the same, and each of the FETs is held at substantially the same DC bias operating point.

In some circuit designs, different device sizes and different bias currents are desired at various stages within the circuit. For example, in a power amplifier design, input stages may be smaller than output stages, allowing input stages to provide a low noise figure while output stages can provide high output power. Particular embodiments may advantageously share different portions of bias current across different active devices to reduce power consumption, for example. In one embodiment described in more detail in an example below, an interstage circuit 150 is configured along a signal path between a first level device (e.g., FET 102a) and a second level device (e.g., FET 102b). The interstage circuit 150 may be configured to couple a node in the signal path to ground at low frequencies to increase the stability of the circuit.

In accordance with some embodiments of the present invention, techniques for sharing and splitting a bias current are provided. This can allow different bias currents to be selected for different devices within a circuit, while obtaining the performance benefits obtained by sharing currents in multiple devices. For example, in some embodiments, a bias current can be split, combined, and routed through combinations of series and parallel bias current connections of active devices within an integrated circuit.

Figure 2:
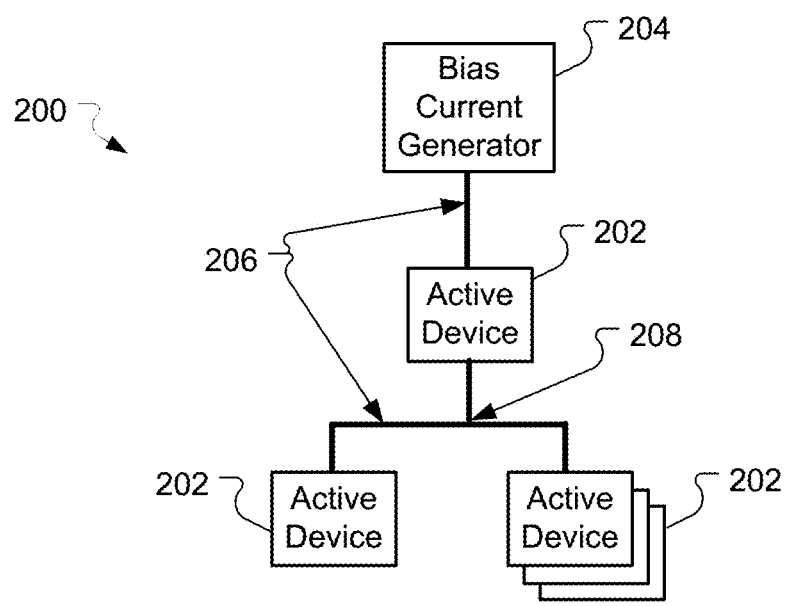
FIG. 2 is a block diagram of a bias current sharing scheme in accordance with some embodiments of the present invention.

FIG. 2 illustrates a high-level conceptual diagram of a bias current distribution scheme in accordance with some embodiments of the invention. An integrated circuit, shown generally at 200, can include a plurality of active devices 202. For example, the active devices can be transistors (e.g., field effect transistors (FETs), bipolar junction transistors (BJT), etc.) fabricated in various technologies (e.g., complementary metal-oxide-semiconductor (CMOS), using various substrates (e.g., Silicon, Gallium Arsenide (GaAs), Silicon Germanium (SiGe), Gallium Nitride (GaN), etc.).

A bias current generator 204 develops a bias current which is distributed to the plurality of active devices. The bias current generator can include power connections, biasing resistors, and other components (not shown) to develop the bias current. For example, bias current can be generated by a self-biasing circuit, a voltage regulator, a current source, and the like. The bias current generator can be coupled to the plurality of active semiconductor devices to establish a bias current path 206 distributing the bias current among the plurality of active devices. The bias current path can be defined by interconnecting components, including for example, wires, traces, resistors, inductors, etc. (not shown), examples of which are described in further detail below. In some embodiments, the bias current path can include one or more components (e.g., an inductor) that pass a low frequency or direct current (DC) bias current while blocking high frequency or alternating current (AC) signals.

The bias current path 206 can distribute bias current to a plurality of active devices, and can include a branch 208 that splits bias current between at least two of the plurality of active devices. Depending on the size (peripheries) of the active devices, the bias current may split equally or unequally (e.g., in proportion to the peripheries) between the devices. For example, active devices can be connected in series, such that a first bias current flows through each of a first active device and a second active device. As another example, active devices can be connect in parallel, such that a first bias current is split so that a first portion of the first bias current passes through a first active device and a second portion of the first bias current passes through a second active device. Various arrangements of the bias current path can be used, and the bias current path can include series connections of devices (such that the same bias current passes through both series-connected devices), parallel connections of devices (such that a bias current is split between the parallel-connected devices), and combinations of series and parallel connections.

Active devices may be transistors configured along one or more signal paths. For example, a plurality of active devices in the same bias current path may be configures along the same signal path. For instance, a first active device may receive a signal and amplify the signal. A signal at an output of the first active device may be coupled to an input of a second active device. The second active device may receive the signal and amplify the signal again. An output of the second active device may be coupled to a third active device, which may amplify the signal yet again, for example. Each of the active devices may be configured to share the bias current and be operable at different operating points. In the above example, the third active device may be coupled to a bias current generator and operate at a first DC voltage level. Bias current from the third active device may be coupled to a branch that splits current between the first and second active devices to set the DC operating points of the first and second active devices.

Figure 3:
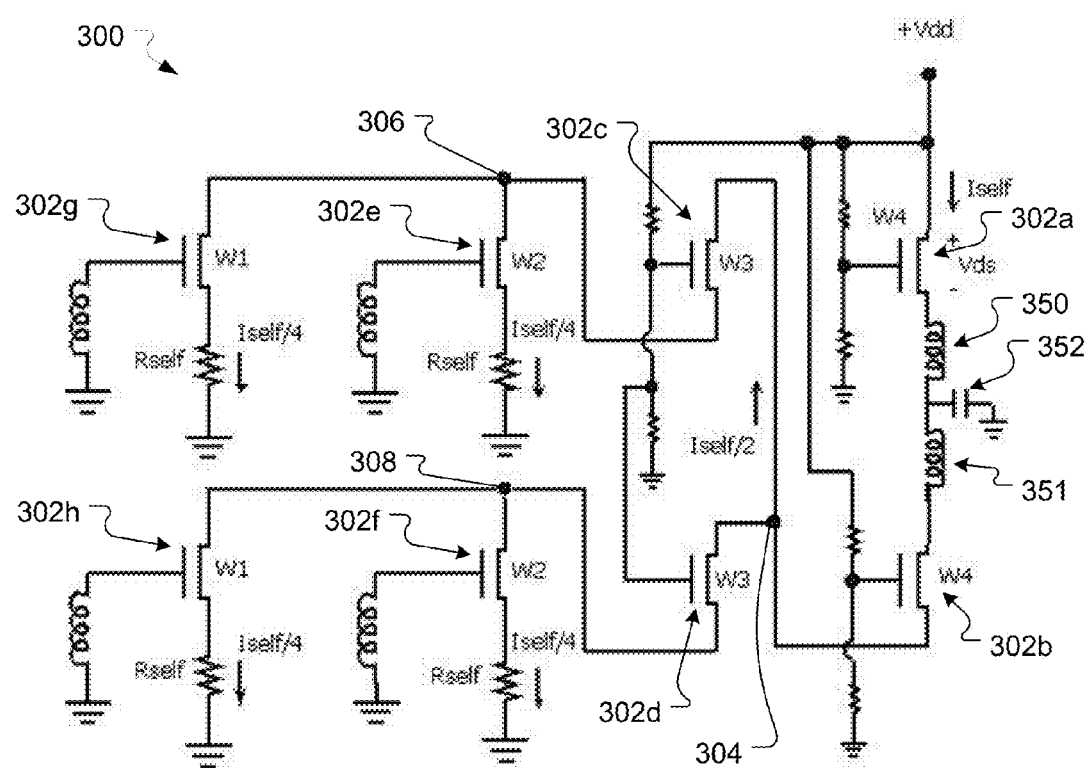
FIG. 3 is a circuit diagram of one example of a bias current sharing scheme in accordance with some embodiments of the present invention.

FIG. 3 illustrates a circuit diagram of another example of a shared bias circuit 300, wherein a shared bias current (Iself) is shared among eight active devices 302 of various peripheries.

Bias current interconnections between the devices may include inductors that block signals (e.g., high frequency signals) while allowing the bias current to flow between the devices. This example illustrates inductors 350 and 351 along the bias current path between active devices 302a and 302b and a DC capacitor 352 that holds a DC bias voltage. Other inductors in the bias current path are not shown. Working from the right to the left of FIG. 3, the bias current is passed in series through devices 302a, 302b, which have peripheries W4. The bias current is split into two portions at node 304, so that a first portion of the bias current passes though device 302c, and the second portion passes through device 302d. Depending on the device peripheries (e.g., for example, setting W1=W2=W3/2=W4/4), the split portions may be the same so that one-half of the bias current (Iself/2) flows in each branch to the left of node 304. The bias currents are further split at nodes 306, 308, so that one-quarter of the bias current (Iself/4) flows through each of devices 302e, 302f, 302g, 302h. In other words, the bias current connection to devices 302e, 302f, 302g, and 302h can be described as a parallel connection. The bias currents are, in this example, established via self-bias resistors (Rself). By maintaining the bias current density approximately constant for each device (e.g., 100 mA/mm, etc.) consistent radio frequency (RF) performance may be maintained for all stages of the circuit.

Figure 4:
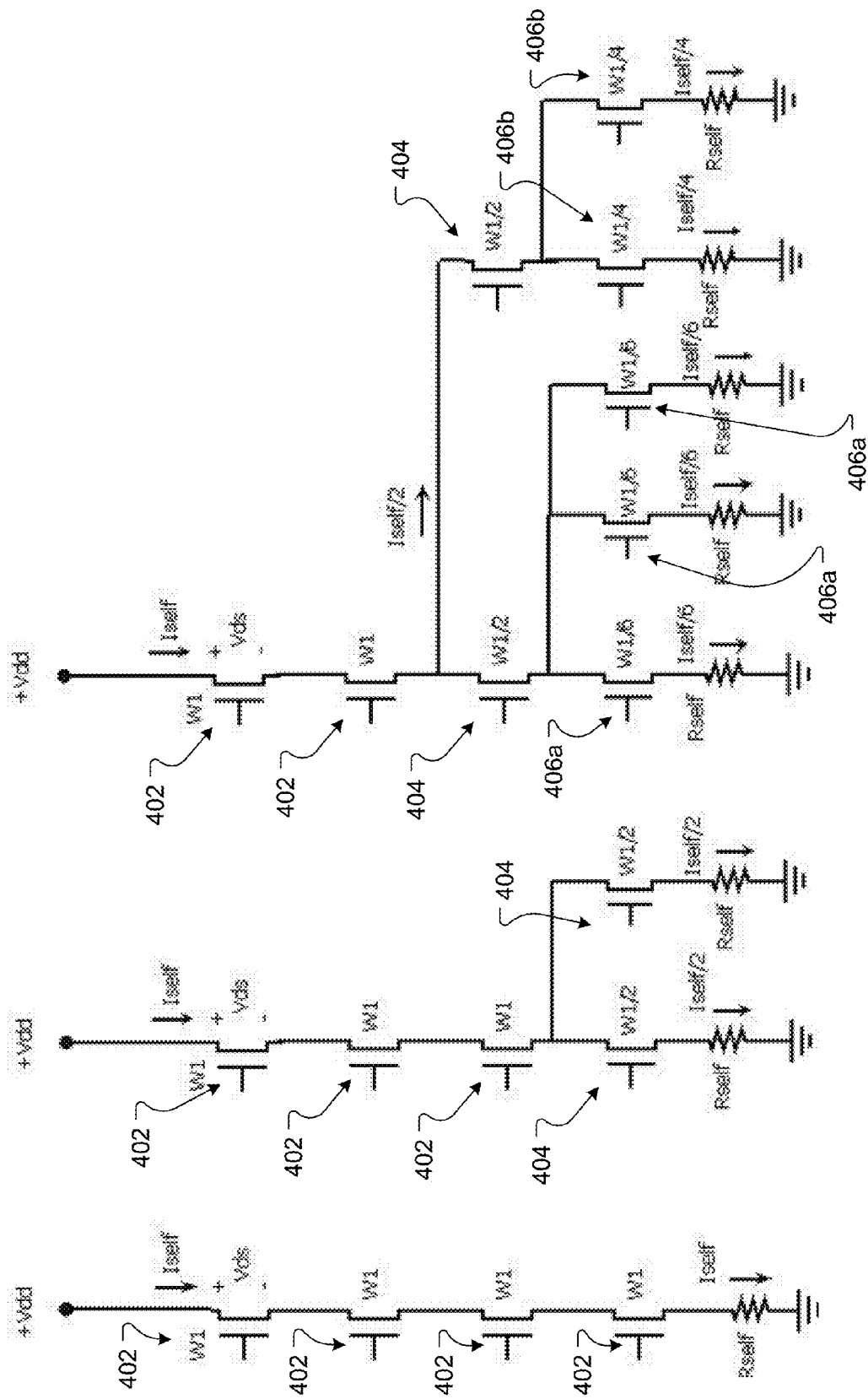
FIG. 4 is circuit diagram showing several examples of bias current sharing in accordance with some embodiments of the invention.

FIG. 4 illustrates various examples of additional ways that a shared bias current can be split within in an integrated circuit. A bias circuit can establish a first bias current (e.g., Iself). In some embodiments, a first level device (e.g., 402) can be coupled to the bias circuit, so that the first bias current passes through the first level device. In some embodiments, a plurality of first level devices can be provided (and can be arranged in series) so that the bias current passes through each first level device.

In some embodiments, a plurality of N second level devices 404 can be coupled to the bias circuit, so that the first bias current is split into N portions and one of each of the N portions passes through one of the plurality of N second level devices (N can be an integer equal or greater than two). For example, as shown in FIG. 4, the second level devices can be coupled to the bias circuit through a first level device. As another example (not shown), the N second level devices can be coupled directly to the bias circuit (e.g., via a splitting node).

In some embodiments, N can be equal to two, in which case the first bias current is split into two portions. In some embodiments, the second level devices can have the same size, in which case the bias current is split into two equal portions. In some embodiments, the second level devices can have different sizes, in which case the bias current can be split into portions proportional to the device sizes.

In some embodiments, a plurality of M third level devices 406 can be coupled to the bias circuit (e.g., directly or indirectly through first and second level devices) so that bias current is split into M portions (M can be an integer equal or greater than two). For example, three third level devices 406a can split current three ways. As another example, two third level devices 406b can split current two ways.

As can be seen from FIG. 4, the portion of bias current passing through each active device may be a function of the bias current generated by the bias circuit, the number of active devices in parallel, and the relative sizes of active devices in parallel, for example. Thus, desired bias currents for each active device in the integrated circuit can be developed. While, in general, the active devices will be part of an operational circuit (e.g., a circuit in a signal path), this is not essential. In some embodiments, one or more "dummy" devices may be included which help to achieve a desired split of bias current portions but do not otherwise function in a circuit.

In some embodiments, the bias current interconnections can be different paths than signal path interconnections between devices for an operational circuit. For example, for a high frequency amplifier, bias current can be provided by low frequency or DC connections through traces and inductors. In contrast, signal connections for the signal being amplified can be provided by high frequency or AC connections through traces and capacitors. An example stabilizing circuit that may be used in the signal path between active devices that share bias current is described in more detail below.

Within an integrated circuit, bias currents can be shared between devices that are part of different functional circuits. For example, an integrated circuit can provide two independent amplifiers that can be used to amplify two different signals. Bias currents can, however, be shared between the two amplifiers using techniques as described above. Bias current sharing can be provided across the two amplifiers by routing the bias currents using DC coupling (e.g., inductors). In contrast, some degree of isolation between the two amplifiers can be maintained by routing the signals (input signal, intermediate signals, output signals, etc.) using AC coupling (e.g., capacitors).

As mentioned above, different bias currents can provide different operating points. Accordingly, active devices within an integrated circuit can be provided different bias currents to provide different DC operating points. Different sizes can be used for active devices to provide desired operational capability.

For the example shown in FIG. 4, it will be appreciated that the number of active devices can be limited by the available voltage supply and the number of voltage drops that can be utilized. A large number of total devices, however, may be accommodated, depending on the number of splits that are used, for example.

Figure 5:
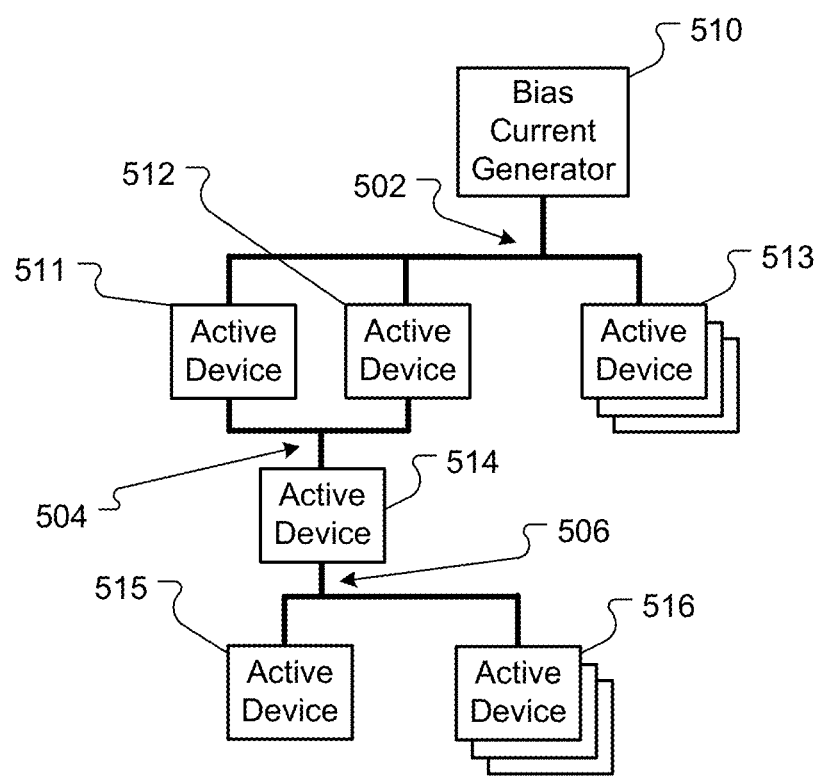
FIG. 5 is a block diagram of a bias current sharing scheme having both parallel and series arrangements in accordance with some embodiments of the present invention.

Although various arrangements of series and parallel devices which share and split bias currents have been shown, numerous other arrangements are possible. For example, any suitable combination of series and parallel connections can be used to split (and combine) bias currents. For example, FIG. 5 illustrates an arrangement having a combination of series and parallel configurations. The circuit of FIG. 5 includes a bias current generator 510, first level active devices 511-513, a second level device 514, and third level devices 515-516. In this example, first level active devices 511-513 may receive the same or different amounts of bias current from bias current generator 510 and are directly connected to bias current generator 510. Second level active device 514 is coupled to bias current generator 510 through active devices 511 and 512, and third level active devices 515-516 are coupled to bias current generator 510 through second level active device 514 and through first level active devices 511 and 512, for example. Bias current may branch at a splitting node (e.g., 502) to two or more devices. Bias current may be combined at a combining node (e.g. 504). Any suitable number of splitting and combining nodes can be included in different embodiments. Moreover, although splits of two and three have been shown, it is to be understood that splits of four, five, six, or larger numbers can be used. As discussed above, current portions flowing from a split to different devices can be equal (e.g., among devices having the same periphery) or unequal (e.g., among devices having different peripheries). Different numbers of devices may similarly be used for combining nodes to provide desired bias currents, for example.

Figure 6:
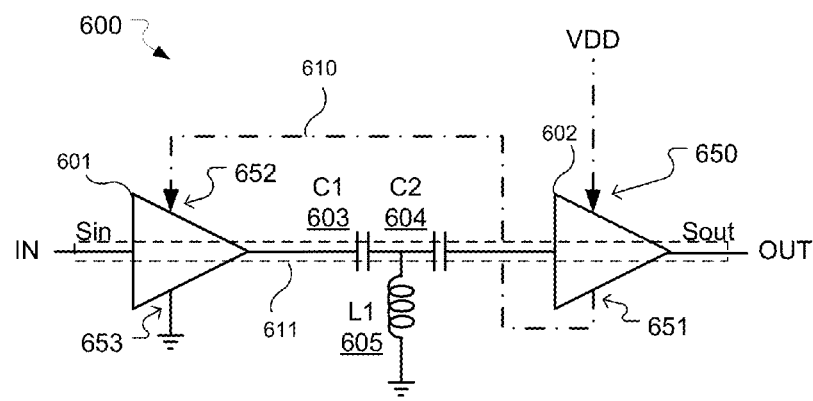
FIG. 6 is a circuit including an interstage circuit for stabilizing devices sharing bias current in accordance with some embodiments of the present invention.

FIG. 6 is a circuit including an interstage circuit for stabilizing devices sharing bias current in accordance with some embodiments of the present invention. In this example, circuit 600 includes amplifier 601 and amplifier 602. Circuit 600 includes a bias current path 610 and an AC signal path 611 (surrounded by dashed lines). Bias current path 610 provides a shared bias current to amplifiers 601 and 602 and establishes an operating point of each amplifier. Voltage and current may be provided by a power supply VDD to terminal 650 of amplifier 602. Bias current may flow through amplifier 602 to establish DC biasing of one or more transistors, for example. Bias current may flow out of terminal 651 of amplifier 602 and into terminal 652 of amplifier 601. Terminal 651 may be coupled to terminal 652 through an inductor (not shown), for example, and may be coupled to ground through a capacitor (sometimes referred to as a "AC bypass capacitor," not shown) to provide an AC ground (e.g., at RF frequencies), for example. Terminal 652 may also be coupled to ground through a capacitor to maintain a DC voltage, for example. Bias current may flow through amplifier 601 to establish DC biasing. In this example, bias current flows from device terminal 653 to ground.

Signal path 611 receives an input signal Sin on an AC input IN of amplifier 601. An output of amplifier 601 may be coupled to an input of amplifier 602 so that the signal IN is amplified first by amplifier 601 and then further amplified by amplifier 602. An AC output terminal OUT of amplifier 602 produces an amplified signal Sout.

At low frequencies, AC bypass capacitors such as capacitors 714, 715, 721 and 722 appear as an impedance to ground or even an open circuit. Such an arrangement may lead to instability at low frequencies due at least in part to the device gain and lack of a true ground along the bias current path. In an integrated circuit application, for example, realizable capacitor values on-chip may be limited to tens of picofarads (pF), for example, and thus may only provide effective RF grounding at frequencies in the hundreds of mega-Hertz (MHz). Thus, below such frequencies, terminal 651 of amplifier 602, for instance, may not be effectively grounded, which may cause circuit 600 to become unstable. In this example embodiment, circuit 600 includes an interstage circuit between an output of amplifier 601 and an input of amplifier 602 to improve stability of circuit 600. In this example, an interstage circuit includes capacitor (C1) 603, capacitor (C2) 604, and inductor (L1) 605. Capacitor 603 includes one terminal coupled to the output of amplifier 601 and one terminal coupled to a terminal of capacitor 604. The other terminal of capacitor 604 is coupled to the input terminal of amplifier 602. An intermediate node between C1 and C2 is coupled to ground through inductor (L1) 605. Capacitor 603 establishes a first low frequency de-coupling between the output of amplifier 601 and the intermediate node. Capacitor 604 establishes a second low frequency de-coupling between the intermediate node and the input of amplifier 602. Inductor 605 functions as a low frequency short circuit, which sets the low frequency voltage at the intermediate node equal to ground. The interstage circuit advantageously improves isolation between amplifiers 601 and 602 that share bias current along path 610. For example, certain example interstage circuits may provide AC de-coupling for potential instability frequencies below hundreds of mega-Hertz so that the instability signal cannot establish a flow between amplifier 601 and 602. Additionally, in some embodiments, an interstage circuit may provide DC de-coupling of bias supply between amplifier 601 and 602. Further, an interstage circuit according to some embodiments may provide AC-coupling of desired RF signal flow from amplifier 601 to amplifier 602. Example low frequencies that may be suppressed by an interstage circuit are frequencies below about 500 MHz (e.g., 500 MHz>f>1 KHz). Example high frequency signals in a signal path are signal frequencies above about 500 MHz (e.g., 500 MHz<f<100 GHz). In some implementations, additional series capacitor and shunt inductors (e.g., to ground) may be added between an output of an active device and an input of a subsequent active device in the signal path to improve stability.

Figure 7:
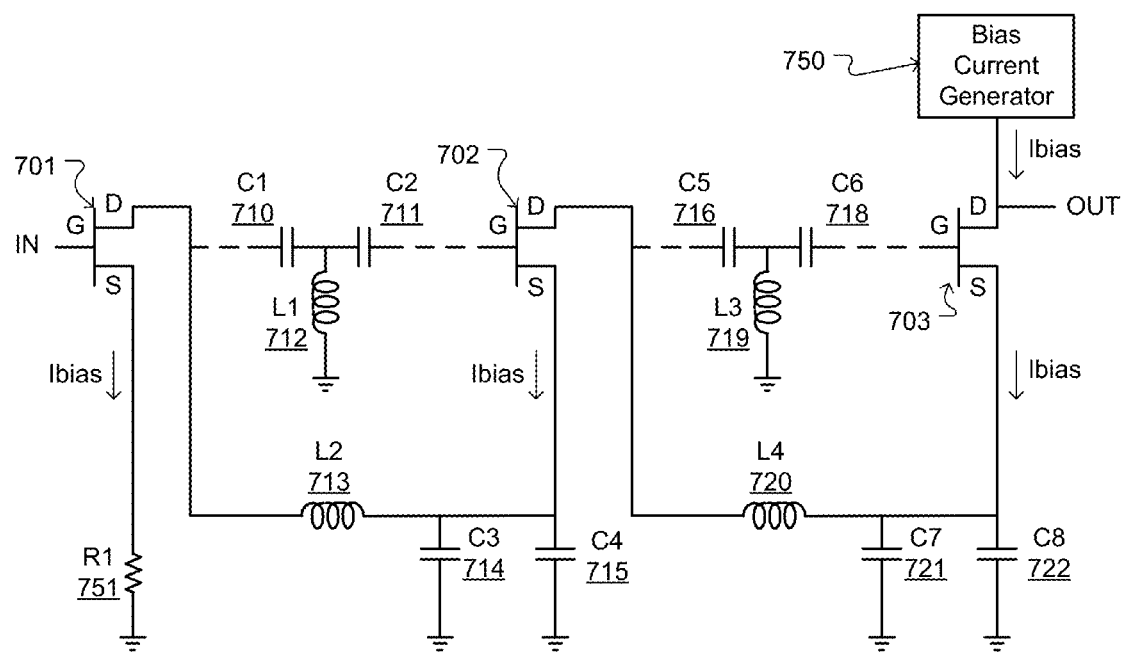
FIG. 7 is an example circuit in accordance with another embodiment of the present invention.

FIG. 7 is an example circuit in accordance with another embodiment of the present invention. In this example, transistors 701-703 share bias current received from bias current generator 750, which may be a power supply to generate Vdd, for example. Transistors 701-703 are field effect transistors (FETs). A bias current path is established from bias current generator 750 as follows. A drain of FET 703 is coupled to bias current generator 750 to receive bias current Ibias. A drain of FET 702 is coupled to a source of FET 703 through inductor (L4) 720 to receive Ibias. A drain of FET 701 is coupled to a source of FET 702 through inductor (L2) 713 to receive Ibias. In this example, a source of FET 701 is coupled to ground through resistor (R1) 751. A voltage applied at a control terminal of FET 701 may create a voltage across resistor 751 to establish a value of the bias current Ibias for FETs 701-703. Inductors 713 and 720 are low frequency short circuits, which pass Ibias, and high frequency open circuits, which prevent AC signals from propagating between the different FET stages along the bias current path. Capacitor (C3) 714 and capacitor (C4) 715 each store a DC voltage to set the operating point of FET 702. Similarly, capacitors (C7) 721 and (C8) 722 store a DC voltage to set the operating point of FET 703. C3 may be greater than C4, and C7 may be similarly greater than C8, to broaden the range of high frequencies coupled to ground and improve the stability of the AC ground at each source terminal.

Interstage stability circuits may be used between FET stages to further improve stability. In this example, a first interstage circuit including capacitor (C1) 710, capacitor (C2) 711, and inductor (L1) 712 is configured between the drain of FET 701 and a gate terminal of FET 702. Similarly, a second interstage circuit including capacitor (C5) 716, capacitor (C6) 718, and inductor (L3) 719 is configured between the drain of FET 702 and a gate terminal of FET 703. A signal provided to the gate terminal of FET 701 may be amplified. The amplified signal may appear at the drain of FET 701. If the signal is a high frequency signal, inductor 713 will prevent the signal from propagating along the bias current path. However, the signal will be AC coupled through capacitors 710 and 711 to the gate of FET 702. Similarly, the signal is amplified by FET 702 and propagates along the signal path through capacitors 716 and 718 to the gate of FET 703. The signal is again amplified by FET 703 and appears at the drain of FET 703, which may be the output of the amplifier, for example. As mentioned above in FIG. 6, an interstage circuit between the drain output and gate input of the two FET stages may improve the stability of the amplifier circuit.

Figure 8:
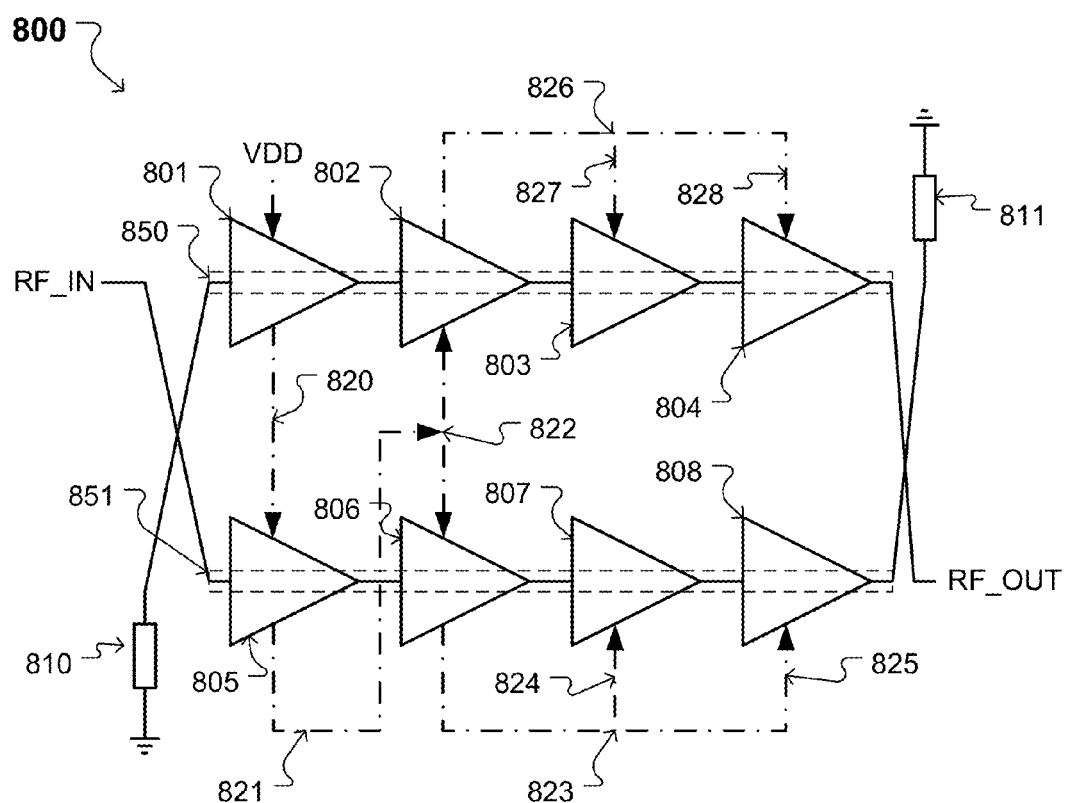
FIG. 8 illustrates an RF amplifier in accordance with another embodiment of the present invention.

FIG. 8 illustrates an RF amplifier 800 in accordance with another embodiment of the present invention. RF amplifier 800 is a block diagram of the example shown in FIG. 3. RF amplifier 800 includes eight (8) stages of active amplification devices 801-808. Each active device is arranged along a bias current path and a signal path. The bias current path provides a bias current to set the operating point of a device. In this example, the signal path provides a signal to be amplified. For instance, stages 801 and 805 are coupled to receive two phases of an RF input signal from an RF input terminal RF_IN and a coupler 801 modeled as impedance 810. The phases of the RF input signal are amplified along parallel signal paths including a first signal path 850 through devices 801-804 and a second signal path 851 through devices 805-808. Signal path 850 provides an amplified RF output signal on an output terminal RF_OUT, and signal path 851 provides another phase of an amplified RF output signal to coupler 811, for example. In this example, bias current is received from a power supply voltage VDD. A bias current path runs from VDD to a bias input terminal of device 801, and from a second terminal of device 801 to a bias input terminal of device 805 along bias current path 820. A bias current path from a second terminal of device 805 runs along path 821 to a branch at 822, which splits a portion of bias current to a terminal of device 802 and a portion of bias current to a terminal of device 806. Accordingly, a portion of the bias current used by device 801 may be received by device 802 to set the operating point of device 802. Similarly, a portion of the bias current used by device 805 may be received by device 806 to set the operating point of device 806. In one embodiment, the portion of bias current received by device 802 is the same as the portion of bias current received by device 806. Thus, devices 801 and 805 may be configured to have the same bias current (in series), and devices 802 and 806 may be configured to have the same bias current (in parallel) so that the parallel signal paths 850 and 851 have similar amplification characteristics.

In this example, equal portions of bias current flow through devices 802 and 806 to additional branches at 826 and 823, respectively. Bias current from a terminal of device 802 is split at branch 826. A first portion of bias current flows to a terminal of device 803 along bias current path 827 and a second portion of bias current flows to device 804 along bias current path 828. Similarly, bias current from a terminal of device 806 is split at branch 823. A first portion of bias current flows to a terminal of device 807 along bias current path 824 and a second portion of bias current flows to device 808 along bias current path 825. In this example, devices 803-804 and devices 824 and 825 receive the same bias current.

Figure 9:
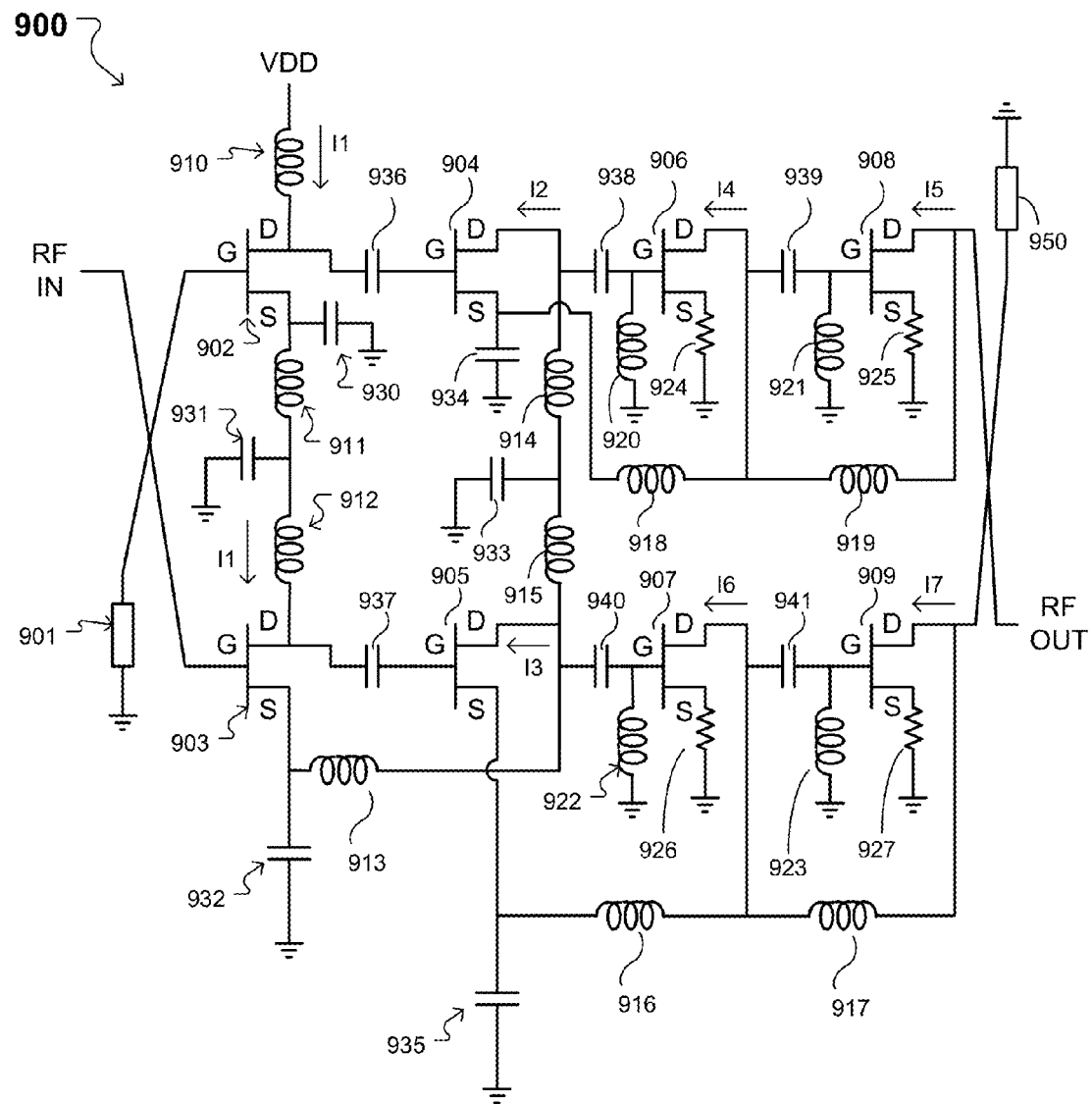
FIG. 9 illustrates an RF amplifier in accordance with another embodiment of the present invention.

FIG. 9 illustrates an RF amplifier 900 in accordance with another embodiment of the present invention. RF amplifier 900 is one example implementation of the amplifier architecture illustrated in FIGS. 3 and 8. In this example, the active devices are single FET transistors 902-909. VDD is coupled to a drain of FET 902 through inductor 910. Inductor 910 functions as a low frequency short circuit allowing a DC bias current I1 to flow from a power supply to the bias current path. The bias current path in circuit 900 flows through FETs 902 and 903 and inductors 910, 911, 912, and 913. Capacitor 930 stores a DC voltage to set the voltage on the source of FET 902. Capacitor 931 stores a DC voltage to set the voltage on the drain of FET 903. Similarly, capacitor 932 stores a DC voltage to set the voltage on the source of FET 903. The bias current and DC voltages establish the operating point for FETs 902 and 903.

The inductors further function as high frequency open circuits. Thus, for example, RF signals received at the gate inputs of FETs 902 and 903 are effectively isolated from each other by inductors 911 and 912. Inductor 913 is coupled between the source of FET 903 and the drain of FET 905 and functions as low frequency short to provide bias current to FETs in the bias current path (e.g., FETs 904 and 905), but also functions as a high frequency open circuit to block the RF signal from propagating to other FETs.

Bias current I1 through FETs 902 and 903 is split between FET's 904 and 905. FETs 904 and 905 may have different sizes than FETs 902 and 903. In this example, FETs 904 and 905 receive equal portions of bias current I1 (e.g., I2=I3=I1/2). The size, W1, of FETs 902 and 903 may be twice the size, W2, of FETs 904 and 905 (e.g., W1=2*W2). Bias current I2 flows through FET 904 and bias current I3 flows through FET 905. Inductors 914-915 pass bias current I2 and block RF signals. Capacitor 933 stores a DC voltage to set the DC drain voltage of FETs 904 and 905.

Bias current I2 is received at the drain terminal of FET 904 and flows out of the source terminal into capacitor 934 and inductor 918. Capacitor 934 sets the DC voltage on the source terminal of FET 904. Inductor 918 couples bias current I2 to FETs 906 and 908. Current I2 is split between FETs 906 and 908. In this example I2 is divided equally between FETs 906 and 908 (e.g., I4=I5=I2/2=I1/4). The size, W2, of FET 904 may be twice the size, W3, of FETs 906 and 908 (e.g., W2=2*W3). Bias current I4 flows through FET 906 and bias current I5 flows through FET 908. Inductor 918 and 919 pass the DC bias current to FETs 906 and 908, respectively, and block high frequency signals. Resistors 924 and 925 are coupled between the sources of FETs 906 and 908, respectively, to set the value of bias currents. Similarly, bias current I3 is coupled through inductors 916-917 and split into bias currents I6 and I7 in FETs 907 and 909, which are set by resistors 926 and 927. The size, W2, of FET 905 may be twice the size, W3, of FETs 907 and 909.

RF amplifier 900 receives an RF signal at the gates of FETs 902 and 903. One RF signal is received out of phase from the output of a coupler illustrated at 901. In this example, the RF signals are amplified in parallel along a signal path from the gates of FETs 902 and 903, through AC coupling capacitors (high frequency short circuits) 936 and 937, from the gate to drain terminals of FETs 904 and 905, through capacitors 938 and 940, from the gate to drain terminals of FETs 906 and 907, through capacitors 939 and 941, and from the gate to drain terminals of FETs 908 and 909. Inductors 920-923 provide low frequency connection to a reference voltage to set the operating point while providing a high impedance to high frequency signals being processed. RF amplifier 900 advantageously shares bias current among a plurality of devices of different sizes operating at different DC operating points to process multiple signals across multiple stages in parallel while using less power.

The above description illustrates various embodiments of the present invention along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. A circuit comprising:
   a bias circuit configured to establish a first bias current;
   a first level device coupled to the bias circuit, wherein the first bias current passes through the first level device to establish an operating point of the first level device, the first level device being an active device;
   a plurality of N second level devices coupled to the bias circuit through the first level device, at least one of the second level devices being an active device, wherein the first bias current is split into N portions, and each one of the N portions passes through one of the plurality of N second level devices to establish an operating point of the at least one active device of the plurality of second level devices; and a plurality of M third level devices coupled to the bias circuit through the first level device and one or more of the second level devices, at least one of the third level devices being an active device, wherein one of the N portions is split into M portions, and each one of the M portions passes through one of the M third level devices to establish an operating point of the at least one active device of the plurality of third level devices.

2. The circuit of claim 1 wherein the second level devices each have approximately the same size, and the N portions of the bias current are equal to each other.

3. The circuit of claim 1 wherein the second level devices each have different sizes, and the N portions of the bias current are not equal to each other, and wherein the N portions of the bias current split in proportion to the sizes of the N second level devices.

4. The circuit of claim 1 wherein the second level devices each have a size different from a size of the first level device.

5. The circuit of claim 1 wherein the operating point of the first level device is different from the operating points of the second level devices.

6. The circuit of claim 1 wherein the first level device and the second level devices are configured along one or more signal paths.

7. The circuit of claim 1 wherein the first level device comprises a first terminal for receiving the first bias current and a second terminal for outputting the first bias current, and wherein the second level devices each comprise a first terminal for receiving one of said N portions of the first bias current, the circuit further comprising a plurality of inductors configured between the second terminal of the first level device and the first terminal of the second level devices.

8. The circuit of claim 1 further comprising an interstage circuit configured along a signal path between the first level device and one of the second level devices, the interstage circuit configured to couple a node in the signal path to ground at low frequencies to increase the stability of the circuit.

9. The circuit of claim 8 wherein the interstage circuit comprises:
a first capacitor;
a second capacitor; and
an inductor,
wherein the first capacitor and second capacitor are configured in series between the first level device and said one of the second level devices,
wherein the node is between the first capacitor and second capacitor, and
wherein the inductor is configured from the node to ground.

10. The circuit of claim 1 wherein the circuit is a monolithic microwave integrated circuit (MMIC).

11. A circuit comprising:
a bias circuit configured to establish a first bias current;
a first level device coupled to the bias circuit, wherein the first bias current passes through the first level device to establish an operating point of the first level device, the first level device being an active device;
a plurality of N second level devices coupled to the bias circuit through the first level device, at least one of the second level device being an active device, wherein the first bias current is split into N portions, and each one of the N portions passes through one of the plurality of N second level devices to establish an operating point of the at least one active device of the plurality of N second level devices; and
a third level device coupled to at least two of the N second level devices, the third level device being an active device, wherein at least two of the N portions are combined and pass through the third level device to establish an operating point of third level device.

12. The circuit of claim 11 wherein the second level devices each have approximately the same size, and the N portions of the bias current are equal to each other.

13. The circuit of claim 11 wherein the second level devices each have different sizes, and the N portions of the bias current are not equal to each other, and wherein the N portions of the bias current split in proportion to the sizes of the N second level devices.

14. The circuit of claim 11 wherein the second level devices each have a size different from a size of the first level device.

15. The circuit of claim 11 wherein the operating point of the first level device is different from the operating points of the second level devices.

16. The circuit of claim 11 wherein the first level device and the second level devices are configured along one or more signal paths.

17. The circuit of claim 11 wherein the first level device comprises a first terminal for receiving the first bias current and a second terminal for outputting the first the bias current, and wherein the second level devices each comprise a first terminal for receiving one of said N portions of the first bias current, the circuit further comprising a plurality of inductors configured between the second terminal of the first level device and the first terminal of the second level devices.

18. The circuit of claim 11 further comprising an interstage circuit configured along a signal path between the first level device and one of the second level devices, the interstage circuit configured to couple a node in the signal path to ground at low frequencies to increase the stability of the circuit.

19. The circuit of claim 18 wherein the interstage circuit comprises:
a first capacitor;
a second capacitor; and
an inductor,
wherein the first capacitor and second capacitor are configured in series between the first level device and said one of the second level devices,
wherein the node is between the first capacitor and second capacitor, and
wherein the inductor is configured from the node to ground.

20. The circuit of claim 11 wherein the circuit is a monolithic microwave integrated circuit (MMIC).

* * * * *

UNITED STATES PATENT AND TRADEMARK OFFICE
CERTIFICATE OF CORRECTION

| | | |
|---|---|---|
| PATENT NO. | : 9,178,515 B2 | Page 1 of 1 |
| APPLICATION NO. | : 13/840473 | |
| DATED | : November 3, 2015 | |
| INVENTOR(S) | : Lyons et al. | |

It is certified that error appears in the above-identified patent and that said Letters Patent is hereby corrected as shown below:

In the claims

Column 14, line 32, Claim 17 delete "the" between first and bias

Signed and Sealed this
Twenty-fourth Day of May, 2016

Michelle K. Lee
*Director of the United States Patent and Trademark Office*